United States Patent [19]

Lee

[11] Patent Number: 4,811,368
[45] Date of Patent: Mar. 7, 1989

[54] METER FOR REMOTE INSPECTION

[75] Inventor: Byoung J. Lee, AnYang, Rep. of Korea

[73] Assignee: Taihan Electric Wire Co., Ltd., Seoul, Rep. of Korea

[21] Appl. No.: 92,880

[22] Filed: Sep. 4, 1987

[30] Foreign Application Priority Data

Feb. 3, 1987 [KR] Rep. of Korea ................. 1099/1987

[51] Int. Cl.⁴ ..................... G08C 19/36; G06M 1/272; G01R 13/38; G01D 5/36
[52] U.S. Cl. ........................................ 377/19; 377/33; 377/53; 340/870.02; 340/870.28
[58] Field of Search .................. 377/19, 33, 34, 35, 377/36, 53; 340/870.02, 870.03, 870.28

[56] References Cited

U.S. PATENT DOCUMENTS

| | | | |
|---|---|---|---|
| 3,127,594 | 3/1964 | Roe et al. | 377/19 |
| 3,519,994 | 7/1970 | Morton | 340/870.02 |
| 3,875,376 | 4/1975 | Kakeno | 377/19 |
| 4,034,292 | 7/1977 | McClelland | 340/870.02 |
| 4,142,096 | 2/1979 | Lehnert | 377/19 |
| 4,608,563 | 8/1986 | Hoffman | 340/870.02 |

Primary Examiner—John S. Heyman

[57] ABSTRACT

A meter for remote inspection having a wheel assembly which enables a counting number indicating the amount of consumption of a measuring object, such as electric energy, or city water or the like to be remotely inspected in a remote inspection center equipped with computer systems. The wheel assembly comprises a plurality of wheels representing respective decimal columns, a series of pinion wheels for transmitting a driving torque, detecting means for detecting the binary-coded signal of a counting number including four photo-sensor portions, and fixed disk means for mounting the detecting means. A predetermined one of side surfaces of some wheels is composed of ten zones which are uniformly divided and selectively colored by two kinds of colors to provide the binary-coded signal of each order of decimals of the counting number. The fixed disks are disposed non-rotatably on an axle of the wheel assembly between the wheels, and mounted with the photo-sensor portions on the side surfaces thereof opposite to the colored side surfaces of the wheels. The photo-sensor portions detect the binary-coded signal of each order of decimals of the counting number from the colored side surfaces of the wheels when positioned adjacent thereto.

4 Claims, 2 Drawing Sheets

0=0101

1=0010

METER FOR REMOTE INSPECTION

This U.S. application stems from Korean Utility Model Registration Application No. 1099/87 filed Feb. 3, 1987.

TECHNICAL FIELD

The present invention relates generally to a meter which enables a counting number indicating the amount of consumption of a measuring object, such as an electric energy, city water or the like, to be perceived in a remote inspection center equipped with computer systems without house-to-house visiting of a meterman and, more particularly, to an improved meter for remote inspection, wherein a wheel assembly is provided with detecting means, comprising a four photo-sensor portion mounted on a disk, and wherein a predetermined one of side surfaces of wheels is divided in a fan-shape and colored by white or black according to each of digits from 0 to 9 marked on the circumferential surfaces thereof, thereby allowing the mechanical counting indications to be detected into the binary-coded signals.

BACKGROUND ART

It is well known that a conventional mechanical meter, such as a watt-hour meter, is equipped with a wheel assembly 10, as shown in FIG. 1. This wheel assembly 10 comprises five wheels 11, 13, 15, 17 and 19, and a series of pinion wheels 21. The first wheel 11 is rotated by a driving means, such as a saw-toothed wheel and cam assembly (not shown), which is driven accordingly as the consumption of the measuring object, such as electric energy, increases. The second to the fifth wheels 13, 15, 17 and 19 can be driven consequently by rotating the first wheel 11 and respectively represent a number of units, tens, hundreds, and thousands by means of the digits from 0 to 9 marked on each circumferential surface thereof. Such digits from 0 to 9 are marked on the circumferential surface of each wheel 11, 13, 15, 17 or 19 in circumferentially spaced-apart relationship. A series of pinion wheels 21 which are engaged with engaging means of each wheel 11, 13, 15, 17 or 19 transmit a driving torque due to rotating the first wheel 11 to the second to fifth wheels 13, 15, 17, and 19. Thus, when the first wheel 11 is rotated, the second to fifth wheels 13, 15, 17 and 19 are driven in due sequence according to the order of decimals.

However, the meter of this mechanical type has a disadvantage that in order to perceive the amount of consumption of the measuring object such as electric energy, the meterman must directly read the counting number represented by the digits on the circumferential surface of the wheels with his house-to-house visiting.

Recently, a public communication network, such as a telephone line or the like, has been widely utilized in various fields in view of the development of modern computer industries. For example, there has been demanded the remote inspection of the meter to inspect the counting number of the meter in a remote inspection center by means of making use of such public communication network without door-to-door visiting of a meterman. To satisfy such a demand, the meters for remote inspection in recent years have various incidental function circuits and expensive interface devices as the occasion demands. This results not only in doubling the difficulty of the remote inspection system design, but also in increasing its production cost. Consequently, it is difficult for such meters for remote inspection based on the prior art to put to practical use remotely inspecting the counting number of the meter.

SUMMARY OF THE INVENTION

It is a principal object of the present invention to provide an improved meter for remote inspection which avoids the above discussed disadvantages of the prior art meters, wherein one of the side surfaces of each of the second to fifth wheels is divided into ten colored zones in a fan-shape and colored by white or black according to each of the digits from 0 to 9 marked on each circumferential surface of the wheels, and wherein photo-sensor portions are fixed on at least one or both side surfaces of each of fixed disks which are disposed non-rotatably on an axle of the wheel assembly between the wheels, thereby enabling mechanical counting indications to be changed into electric code signals.

The invention in its broad form resides in a meter for remote inspection including a wheel assembly comprising a first wheel continuously rotatable accordingly as the consumption of a measuring object increases; second to fifth wheels rotatable consequently by rotating the first wheel, a predetermined one of the side surfaces of each of said second to fifth wheels being composed of ten zones which are uniformly divided in a fan-shape and selectively colored by two kinds of colors according to each position of digits 0 to 9 marked on respective circumferential surfaces of said second to fifth wheels; a series of pinion wheels engaged with each of the wheels and being able to transmit a driving torque, due to rotating of said first wheel, to said second to fifth wheels in a ratio of one to ten; two or more fixed disk means disposed non-rotatably on an axle of the wheel assembly between the wheels; detecting means for detecting the binary-coded signal of the counting number from said colored side surfaces on the wheels which is aligned with respect to a reference position when required, including first to fourth photo-sensor portions mounted on respective side surfaces of said fixed disk means opposite to said respective colored side surfaces of said second to fifth wheels so as to detect the binary-coded signal for each order of decimals of the counting number from said respective colored side surfaces when positioned adjacent said respective photo-sensor portions by said driving torque, and to output the detected binary-coded signals to a decoding circuit in order to code into the binary-coded decimal representation (BCD); and each of said first to fourth photo-sensor portions being composed of at least four photo-sensing elements, each of which is fixed at distance spaced from a center of said fixed disk means on corresponding one of ten zones formed on said side surfaces of said fixed disk means in the same manner as the division of said colored side surface of each of said second to fifth wheels, such that each of said four photo-sensing elements is activated by the adjacent or opposite positioning of each of a certain four colored zones of said respective colored side surfaces to detect the binary logic signal zero or one according to the color thereof.

In a preferred embodiment, said photo-sensing elements are disposed on four successive zones of said side surface of said fixed disk means which is divided into ten zones, and said colored side surface is composed of six zones colored by white in each position corresponding to the digits 2,4,5,6,7 and 9 marked on the circumferential surface of said wheels, and four zones colored by black in each position corresponding to the digits 0,1,3 and 8 marked on the circumferential surface of said wheels so as to allow said photo-sensor portion to detect the binary-coded signal of each order of decimals of the counting number.

Said wheel assembly further includes a sixth wheel with said colored side surface rotatable consequently by rotating of said fifth wheel, and a fifth photo-sensor portion for detecting the binary-coded signal of a corresponding order of decimals from said colored side surface of said sixth wheel.

BRIEF DESCRIPTION OF THE DRAWINGS

A more detailed understanding of the invention may be had from following description of the preferred embodiment, given by way of example, only, with reference to the accompanying drawings wherein.

DETAILED DESCRIPTION OF THE INVENTION

Figure 4:
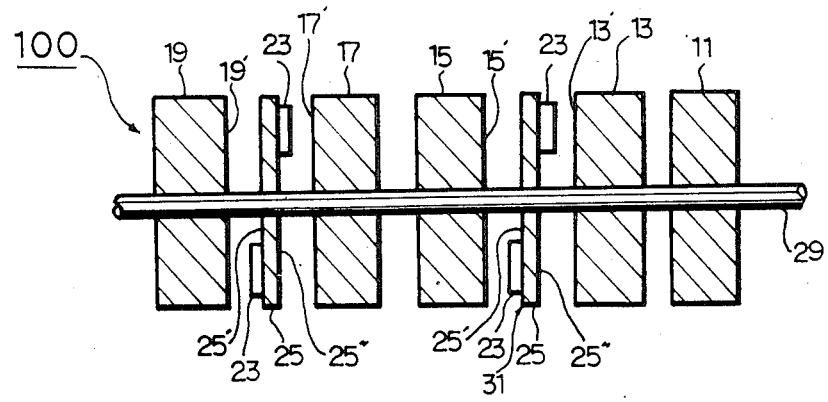
FIG. 4 is a schematic, longitudinal sectional view showing a preferred embodiment of the wheel assembly according to the present invention.

Referring now to the several drawings, especially to FIG. 4, there is illustrated a general construction of a preferred embodiment of the wheel assembly 100 of the meter for remote inspection according to the present invention. This wheel assembly 100 includes five wheels 11, 13, 15, 17 and 19, and a series of pinion wheels (not shown in FIG. 4). The first wheel 11 represents a number of figure down one place of decimals, and second to fifth wheels 13, 15, 17 and 19 respectively represent a number of units, tens, hundreds, thousands by means of the digits from 0 to 9 marked on each circumferential surface thereof. Such digits from 0 to 9 are marked on the circumferential surface of each wheel 11, 13, 15, 17 or 19 in circumferentially spaced-apart relationship. A series of pinion wheels (not shown in FIG. 4) are engaged with engaging means (not shown) of each wheel 11, 13, 15, 17 or 19 for transmitting the driving torque, due to rotating of the wheel 11, to the second to fifth wheels 13, 15, 17 and 19 in a ratio of one to ten.

Figure 1:
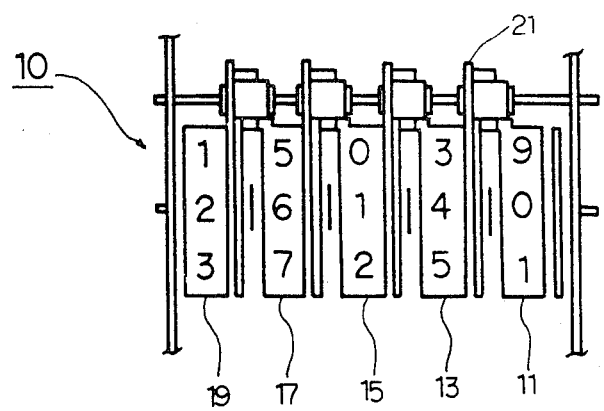
FIG. 1 is a fragmentary, schematic view showing the wheel assembly of a prior art meter.
Figure 2:
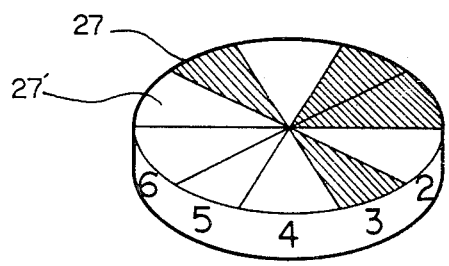
FIG. 2 is a schematic, perspective view illustrating the wheel embodied in the present invention.

FIG. 2 shows one embodiment of the second to fifth wheels 13, 15, 17 and 19 with a colored side surface embodied in the present invention as shown in FIG. 4. Although, in FIG. 2, the wheel 27 assumes the form of a round plate and has a colored side surface 27', it should be noted that the wheel 27 is provided with engaging means for transmitting the driving torque (not shown in FIG. 2). The colored side surface 27' is composed of ten zones uniformly divided in a fan-shape and colored by white or black according to each of the digits from 0 to 9 marked on the circumferential surface of the wheel 27 so as to allow photosensor portions 23 (see FIG. 3) to detect binary-coded signals of n bit, preferably, 4 bit from them, as will be explained below. In this embodiment, the white zones are the divided zones corresponding to the digits 2, 4, 5, 6, 7 and 9, and the black zones (the hatched zones in FIG. 2) are the divided zones corresponding to the digits 0, 1, 3 and 8.

As shown in FIG. 4, the colored side surfaces are disposed on the side surfaces 13', 15', 17' and 19' of each of the second to fifth wheels, that is, on one side surface 13' of the second wheel 13 and one side surface 15' of the third wheel 15 opposite to it, and on one side surface 17' of the fourth wheel 17 and one side surface 19' of the fifth wheel 19 opposite to it.

The wheel assembly 100 also includes detecting means 31 for detecting the binary-coded signals of the counting number which is composed of four photo-sensor portions 23 mounted on respective fixed disks. Each photo-sensor portion 23 is composed of four photo-sensing elements 71, 72, 73 and 74 (see FIG. 3).

Figure 3:
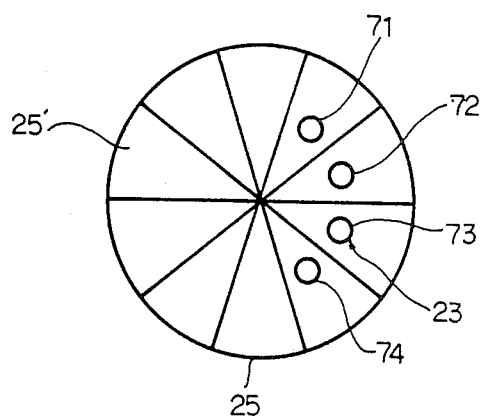
FIG. 3 is an elevational view illustrating the fixed disk mounted the photo-sensor portion embodied in the present invention.

FIG. 3 shows one embodiment of the fixed disk 25 with the photo-sensor portion 23 embodied in the present invention as shown in FIG. 4. In FIG. 3, the fixed disk 25 assumes the form of a round plate. Each side surface 25' and 25" (see FIG. 4) of the fixed disk 25 is uniformly divided into ten zones about the center thereof in the same manner as the division of the colored side surface 27' of the wheel 27, as shown in FIG. 2, and four photo-sensing elements 71, 72, 73 and 74 of the photo-sensor portions 23 are then disposed one after another on respectively corresponding divided zones at a distance spaced from the center of the fixed disk 25. In this embodiment, a total number of the photo-sensing elements is at least sixteen because each photo-sensing portion consists of at least four photo-sensing elements so as to allow the counting indication or four colored zones of colored side surfaces equivalent to one digit of each order of the decimals to be represented by the binary-coded signal of 4 bit, as will be explained below.

Referring again to FIG. 4, the photo-sensor portion 23 of the detecting means 31 is fixed on both side surfaces 25' and 25" of each of two fixed disks 25 which are disposed non-rotatably on the axle 29 of the wheel assembly 100 between the second and third wheels 13 and 15, and the fourth and fifth wheels 17 and 19. It should be understood that each photo-sensor portion 23 which detects the binary-coded signal is connected to computer systems (not shown) in the remote inspection center, through the interface circuit and the public communication network (not shown) such as the telephone lines or the like.

The binary-coded signal detecting of the detecting means embodied in the present invention will now be described. Although, in the preferred embodiment of the present invention, four photo-sensor portions and four colored side surfaces are utilized to detect binary-coded signals of the counting number, it will be understood that for simplifying the description only one photo-sensor portion and one colored surface are explained.

With reference specifically to the drawing, FIGS. 6 A and B show respectively a schematic illustration for explaining the binary-coded signals which are detected from the counting indication or four colored zones of side surface by means of making use of the photo-sensor portion embodied in the meter for remote inspection according to the present invention.

In case that each photo-sensor portion of the detecting means is formed of four photo-sensing elements, namely 4 bit so as to allow them to detect the binary-coded signal from the counting indication or four colored zones of side surfaces equivalent to one digit of each order of the decimals, such one digit of each order of decimals is able selectively to be represented by 16 binary-coded signals of 4 bit depending on the disposition and number of the white and black zones because each photo-sensing element detects or reads the binary logic signal 0 and 1, respectively for white and black zones. However, in this embodiment according to the present invention, there is need to detect or read ten binary-coded signals of 4 bit for each order of decimals, since the number of the digits in each order of decimals is ten (from 0 to 9). This is adjustable by selectively dispositioning the white and black zones on the colored side surface of each of the second to fifth wheels. In the preferred embodiment of the present invention as shown in FIGS. 6 A and B, the black zones are disposed in the position corresponding to the digits 0, 1, 3 and 8, and the white zones are disposed in the position corresponding to the digits 2, 4, 5, 6, 7 and 9.

Table 1 shows the relationship between each of the digits from 0 to 9 of each order of decimals and the binary-coded signal is as follows. Reference mark A, B, C and D designate the position of the photo-sensing elements.

TABLE 1

THE RELATIONSHIP BETWEEN THE COUNTING DIGIT AND THE CODE SIGNAL.

| COUNTING DIGIT | BINARY-CODED SIGNAL | | | | SEXADECIMAL NUMBER TO 16 CODE SIGNAL OF 4 BIT |
|---|---|---|---|---|---|
| | A | B | C | D | |
| 0 | 0 | 1 | 0 | 1 | 5 |
| 1 | 0 | 0 | 1 | 0 | 2 |
| 2 | 1 | 0 | 0 | 1 | 9 |
| 3 | 0 | 1 | 0 | 0 | 4 |
| 4 | 1 | 0 | 1 | 0 | A |
| 5 | 1 | 1 | 0 | 1 | D |
| 6 | 1 | 1 | 1 | 0 | E |
| 7 | 1 | 1 | 1 | 1 | F |
| 8 | 0 | 1 | 1 | 1 | 7 |
| 9 | 1 | 0 | 1 | 1 | B |

Figure 6A:
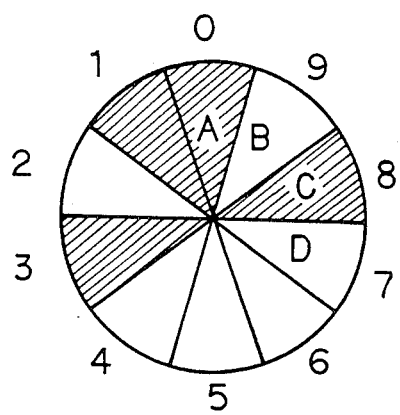
FIGS. 6 A and B are respectively a schematic illustration for explaining the binary-coded signals which are detected from the counting indication by means of making use of the photo-sensor portion embodied in the meter for remote inspection according to the present invention.
Figure 6B:
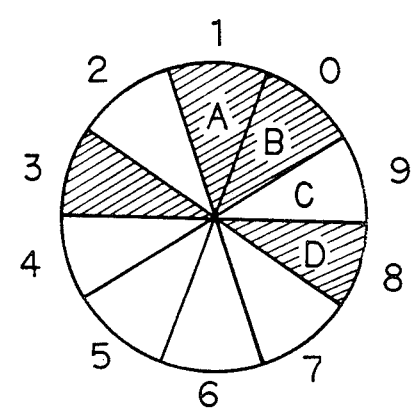

When a certain, four white or black zones of the side surface of each of the second to fifth wheels are registered with four photo-sensing elements A, B, C and D which are fixed on the side surface of each fixed disk 25 as shown in FIGS. 6 A and B, the photo-sensing element A, B, C and D reads or detects the binary-coded signal 0101 at the digit 0 of each order of decimals (FIG. 6A), and reads or detects the binary-coded signal 0010 at the digit 1 of each order of decimals (FIG. 6B). In the same manner, the other digits 2 through 9 can be represented by corresponding binary-coded signals as shown in table 1. Thus, the counting number of four figures is represented by the binary-coded signals by the detecting means which is composed of four photo-sensor portions. This binary-coded signal for the counting number of four figures is then coded into the binary-coded decimal representation (BCD) by means of the decoding circuit.

The operation of the meter for remote inspection according to the present invention is as follows.

At first, the first wheel 11 is rotated by the driving means accordingly as the consumption of the measuring object such as the electric energy increases. The second to fifth wheels 13, 15, 17 and 19 are then driven consequently by a series of pinion wheels (not shown if FIG. 4) to transmit the rotation power of the first wheel 11 to the next. For transmitting the driving torque due to rotating of the first wheel 11 to the second to fifth wheels 13, 15, 17 and 19, a series of pinion wheels are engaged with the first to fifth wheels. Thus, when the first wheel 11 is rotated, the second to fifth wheels 13, 15, 17 and 19 are rotated in due sequence according to the order of decimals.

At this time, when the power source is supplied to the detecting means, each photo-sensor portion 23 on the fixed disk 25 detects or reads the binary-coded signal of 4 bit from four white or black zones of the corresponding side surface of each wheel 13, 15, 17 or 19, as described above. Accordingly, the counting number of four figures is represented by the binary-coded signals by means of at least 16 photo-sensing elements. These binary-coded signals are coded in BCD through the decoding circuit and then transmitted to the computer systems in the remote inspection center through the interface circuit and the public communication network such as the telephone lines or the like.

Figure 5:
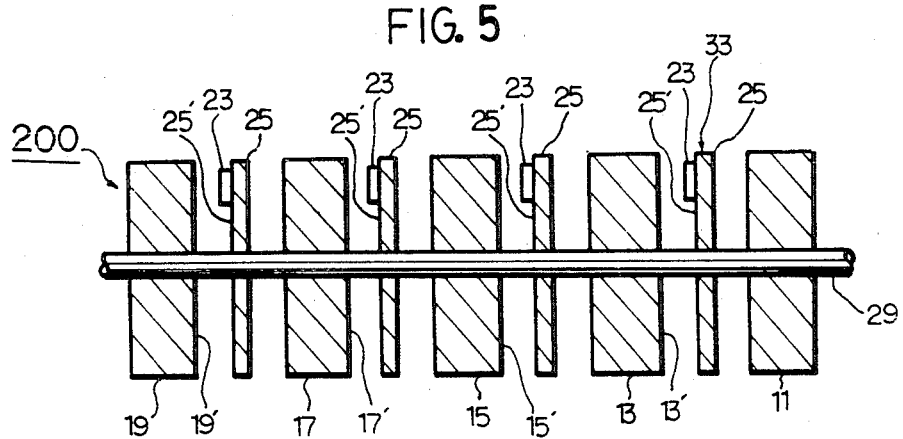
FIG. 5 is a schematic, longitudinal sectional view showing an alternative preferred embodiment of the wheel assembly according to the present invention.

In FIG. 5, an alternative preferred embodiment of the wheel assembly 200 according to the present invention is shown. The wheel assembly 200 is similar to that as shown in FIG. 4, but four fixed disks 25 for mounting the photo-sensor portions are non-rotatably disposed on the axle 29 of the wheel assembly 200 between the wheels 11 and 13, 13 and 15, 15 and 17, and 17 and 19. Only one side surface 25' of each fixed disk 25 is uniformly divided into ten zones in a fan-shape, and four photo-sensing elements 71, 72, 73 and 74 of the photo-sensor portion 23 are then disposed one after another on respectively corresponding divided zones at a distance spaced from the center of the fixed disk 25, as shown in FIG. 3. The colored side surface 27' which is composed of ten zones uniformly colored by white or black according to each of the digits from 0 to 9 marked on the circumferential surface of the wheel 27 as shown in FIG. 2 is disposed just opposite to such one side surface 25' of each fixed disk 25. The operation of this wheel assembly 200 is equal to that of the wheel assembly 100 as shown in FIG. 4.

From the foregoing, it can be seen that there has been provided an improved meter which enables the counting number indicating the amount of consumption of the measuring object, such as the electric energy, city water or the like, to be inspected in the remote inspection center by means of making use of the interface circuit and the public communication network such as the telephone lines or the like. The present invention also provides an improved meter for remote inspection that the photo-sensor portion detects the binary-coded signal without contacting with the wheels. Accordingly, it can be seen that there is no need to change the overall design of the conventional mechanical wheel assembly 10 in order to dispose the fixed disks and the photo-sensor portions thereon.

It will be understood that the above description of the present invention is susceptible to various modifications, changes and adaptations, and the same are intended to be comprehended within the meaning and range of equivalents of the appended claims.

For example, the circumferential surface of each of the second to fifth wheels 13, 15, 17 and 19 may be divided and colored by white or black according to each of the digits from 0 to 9 thereon, and the fixed means corresponding to the fixed disk 25 and equipped with the photo-sensor portion may be disposed above the circumferential surface of each of the wheels 13, 15, 17 and 19 for detecting the binary-coded signal from the colored zones thereof.

What is claimed is:

1. A meter for remote inspection which enables a counting number indicating the amount of consumption of a measuring object to be inspected in a remote inspection center equipped with computer systems, including a wheel assembly, said wheel assembly comprising:
   a first wheel continuously rotatable accordingly as the consumption of said measuring object increases;
   second to fifth wheels rotatable consequently by rotating of said first wheel, a predetermined one of side surfaces of each of said second to fifth wheels being composed of ten zones which are uniformly divided in a fan-shape and selectively colored by two kinds of colors in a predetermined code according to each position of digits 0 to 9 marked on respective circumferential surfaces of said second to fifth wheels;
   a series of pinion wheels engaged with each of the wheels and being able to transmit a driving torque due to rotating of said first wheel to said second to fifth wheels in a ratio of one to ten;
   at least two fixed disk means disposed non-rotatably on an axle of the wheel assembly between the wheels;
   detecting means for detecting a binary-coded signal of the counting number from said predetermined coded colored side surfaces on the wheels which are aligned with respect to a reference position when required, including first to fourth photo-sensor portions mounted on respective side surfaces of said fixed disk means opposite to said respective colored side surfaces of said second to fifth wheels, so as to detect the binary-coded signal for each order of decimals of the counting number from said respective colored side surfaces when positioned adjacent said respective photo-sensor portions by said driving torque, and to output the detected binary-coded signals to a decoding circuit in order to code into the binary-coded decimal representation (BCD); and
   each of said first to fourth photo-sensor portions being composed of at least four photo-sensing elements, each fixed at a distance spaced from a center of said fixed disk means on a corresponding one of ten zones formed on said side surface of said fixed disk means in the same manner as the division of said colored side surface of each of said second to fifth wheels, such that each of said four photo-sensing elements is activated by the adjacent or opposite positioning of each of a certain four colored zones of said respective colored side surfaces to detect the binary logic signal zero or one according to the color thereof.

2. A meter according to claim 1, wherein said photo-sensing elements are disposed on four successive zones of said side surfaces of said fixed disk means which is divided in ten zones, and said colored side surface is composed of six zones colored by white in each position corresponding to the digits 2, 4, 5, 6, 7 and 9 marked on the circumferential surface of said wheels, and four zones colored by black in each position corresponding to the digits 0, 1, 3 and 8 marked on the circumferential surface of said wheels so as to allow said photo-sensor portion to detect the binary-coded signal of each other of decimals of the counting number.

3. A meter according to claim 1, wherein said wheel assembly further includes a sixth wheel with a colored side surface rotatable consequently by rotating of said fifth wheel, and a fifth photo-sensor portion for detecting a binary-coded signal of a corresponding order of decimals from said colored side surface of said sixth wheel.

4. A meter according to claim 2, wherein said wheel assembly further includes a sixth wheel with a colored side surface rotatable consequently by rotating of said fifth wheel, and a fifth photo-sensor portion for detecting a binary-coded signal of a corresponding order of decimals from said colored side surface of said sixth wheel.

* * * * *